United States Patent [19]
Rynne et al.

[11] Patent Number: 5,912,501
[45] Date of Patent: Jun. 15, 1999

[54] ELIMINATION OF RADIUS OF CURVATURE EFFECTS OF P-N JUNCTION AVALANCHE BREAKDOWN USING SLOTS

[75] Inventors: D. Michael Rynne, Saratoga, Calif.; Richard C. Smoak, Austin, Tex.

[73] Assignee: Advanced Micro Devices, Inc., Sunnyvale, Calif.

[21] Appl. No.: 08/897,265

[22] Filed: Jul. 18, 1997

[51] Int. Cl.⁶ .................................. H01L 29/732
[52] U.S. Cl. ............................ 257/508; 257/517
[58] Field of Search ................... 257/500, 517

[56] References Cited

U.S. PATENT DOCUMENTS

| | | | |
|---|---|---|---|
| 4,079,408 | 3/1978 | Kwap et al. | 257/517 |
| 4,292,642 | 9/1981 | Appels et al. | 357/13 |
| 4,409,606 | 10/1983 | Wagenaar et al. | 357/13 |
| 4,533,430 | 8/1985 | Bower | 156/643 |
| 4,534,824 | 8/1985 | Chen | 156/628 |
| 4,579,812 | 4/1986 | Bower | 430/313 |
| 4,621,414 | 11/1986 | Iranmanesh | 29/576 W |
| 4,626,317 | 12/1986 | Bonn | 156/643 |
| 4,733,287 | 3/1988 | Bower | 357/34 |
| 4,745,087 | 5/1988 | Iranmanesh | 437/69 |
| 4,749,661 | 6/1988 | Bower | 437/33 |
| 4,771,418 | 9/1988 | Narasimhan et al. | 370/58 |
| 4,795,721 | 1/1989 | Bower et al. | 437/67 |
| 4,803,176 | 2/1989 | Bower | 437/33 |
| 4,860,082 | 8/1989 | Moriyama et al. | 357/49 |
| 4,933,733 | 6/1990 | Iranmanesh et al. | 357/72 |
| 4,963,957 | 10/1990 | Ohi et al. | 257/508 |
| 5,208,169 | 5/1993 | Shah et al. | 437/31 |
| 5,268,312 | 12/1993 | Reuss et al. | 437/30 |
| 5,294,825 | 3/1994 | Nakagawa et al. | 257/487 |
| 5,386,140 | 1/1995 | Matthews | 257/592 |
| 5,485,029 | 1/1996 | Crabbe et al. | 257/517 |
| 5,496,746 | 3/1996 | Matthews | 437/31 |
| 5,554,872 | 9/1996 | Baba et al. | 257/342 |
| 5,731,623 | 3/1998 | Ishimaru | 257/517 |

*Primary Examiner*—David B. Hardy
*Attorney, Agent, or Firm*—H. Donald Nelson

[57] ABSTRACT

A semiconductor device with a base region that terminates on the surface of a slot that surrounds the base region. The base region terminates substantially perpendicular to the surface of the slot. The collector-base junction has substantially no cylindrical or spherical curvature.

9 Claims, 7 Drawing Sheets

ELIMINATION OF RADIUS OF CURVATURE EFFECTS OF P-N JUNCTION AVALANCHE BREAKDOWN USING SLOTS

BACKGROUND OF THE INVENTION

CROSS REFERENCE TO RELATED APPLICATIONS

This application is related to application, Ser. No. 08/897,165, filed on the filing date of this application, entitled REDUCTION OF DEPLETION SPREADING SIDEWAYS UTILIZING SLOTS, application, Ser. No. 08/897,166, filed on the filing date of this application, entitled USE OF TUNGSTEN FILLED SLOTS AS GROUND PLANE IN INTEGRATED CIRCUIT MANUFACTURE AND ALSO FOR LOW RESISTANCE CONTACT, application, Ser. No. 08/897,167, filed on the filing date of this application, entitled USE OF MULTIPLE SLOTS SURROUNDING BASE REGION OF A BIPOLAR JUNCTION TRANSISTOR TO INCREASE CUMULATIVE BREAKDOWN VOLTAGE and application, Ser. No. 08/897,082, filed on the filing date of this application, entitled USE OF SLOTS IN DEEP ISOLATION AND COLLECTOR PICKUP REGIONS FOR MINIMIZATION OF SUB-COLLECTOR UP-DIFFUSION.

FIELD OF THE INVENTION

This invention relates generally to high voltage semiconductor devices. More particularly, this invention relates to high voltage bipolar semiconductor devices in which radius-of-curvature effects that limit pn-junction breakdown voltage are prevented.

DISCUSSION OF THE RELATED ART

The bipolar transistor is an electronic device with two pn junctions in very close proximity. There are three device regions: an emitter region, a base region, and a collector region. The two pn junctions are known as the emitter-base (EB) junction and the collector-base (CB) junction. Modulation of the current in one pn junction by means of a change in the bias of the other nearby junction is called bipolar-transistor action. Because the mobility of minority carriers (electrons) in the base region of npn transistors is higher than that of holes in the base of pnp transistors, higher frequency operation and higher speed performances can be obtained with npn devices. For this reason, the following discussion will be in terms of npn transistors but it is to be understood that the discussion is applicable to pnp transistors as well.

The desired device characteristics of bipolar transistors include: high current gain, high frequency ac operation, fast switching speed, high device-breakdown voltages, minimum device size (to achieve high functional density) and high reliability of device operation. In order for high-frequency ac performance and fast switching speed to be achieved, the parasitic resistances of the transistor; $R_E$, $R_B$, and $R_C$, and the parasitic junction capacitances; $C_{EB}$, $C_{CB}$, and $C_{CB}$ must be minimized. In addition, high-level injection effects, for example, the Kirk effect should be avoided. For faithful amplification of ac signals, the Early voltage must be high.

The mechanism of avalanche breakdown in a pn junction limits the maximum reverse-bias voltages that can be applied to a pn junction and is also responsible for some of the maximum operating voltage values in bipolar transistors. The breakdown of the CB junction with $I_E$=0 ($BV_{CBO}$) is due to this mechanism. The doping on the lightly doped side of the collector typically determines $BV_{CBO}$. However, in CB junctions in planar bipolar transistors, the pn junction is formed by diffusion into the silicon at openings in the surface $SiO_2$ layer. The impurities will diffuse downward through the opening and sideways under the edges of the $SiO_2$ layer. Hence, the pn junction has a plane region with nearly cylindrical edges and spherical corners. FIG. 14 shows the shape of a base region that has been formed by a diffusion process through a rectangular opening in the $SiO_2$ layer. The rectangle, indicated at 1400, bounded by sides 1402, 1404, 1406, and 1408 represents the dimensions of the opening through which the impurities were diffused. The regions 1410 are regions in which the impurities have diffused sideways under the $SiO_2$ layer and the regions 1410 have a cylindrical shape. The regions 1412 are regions in which the impurities have diffused sideways at the corners of the rectangle under the $SiO_2$ layer and the regions 1412 have a spherical shape. Such junction curvatures enhance the electric field in the curved parts of the associated depletion regions. The enhanced electric field reduces the breakdown voltage below that predicted by the one-dimensional junction theory. FIG. 15 shows the effects of the curvature of the collector-base junction on breakdown voltage. The breakdown voltage is plotted versus impurity concentration for selected radii of curvature, $r_j$, from 0.1 micron to 10 microns and a plot of no curvature ($r_j=\infty$). The smaller radii of curvature are found in devices that have very shallow base regions and as can be seen from FIG. 15, as the radii of curvature becomes smaller the breakdown voltage becomes significantly smaller. This indicates that in the drive towards smaller and smaller devices the decrease in breakdown voltage becomes a very significant problem. For example, a comparison of the breakdown voltages for various devices with an impurity concentration $N_B$ of $10^{15}$ shows the significant effects of increasing the curvature. The breakdown voltage for a device having a plane junction (no curvature) is approximately 320 V, the breakdown voltage for a spherical junction with a radius of 10 microns is approximately 160 volts and the breakdown voltage for a spherical junction with a radius of 0.1 microns is only approximately 9.5 V.

Therefore, what is needed is a semiconductor device that does not exhibit the significant decrease in breakdown voltage because of either cylindrical or spherical curvature of the collector-base junction.

SUMMARY OF THE INVENTION

The present invention is directed to a semiconductor device having a base region that terminates on the surface of a slot that surrounds the base region. The base region terminates substantially perpendicular to the surface of the slot. The collector-base junction of the semiconductor device has substantially no spherical or cylindrical surface.

The base region and the surrounding slot are formed in an epitaxial region of the semiconductor device. The semiconductor device has a buried layer formed on a portion of the interface between the epitaxial region and a substrate region.

The epitaxial region is surrounded by isolation structures that extend from the surface of the device to the interface between the epitaxial region and the substrate region.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to a specific embodiment of the present invention that illustrates the best mode presently contemplated by the inventors for practicing the invention and which is set forth in the accompanying drawings. The drawings referred to in this description are diagrammatic and, for clarity, are not drawn to scale. The drawings illustrate only one portion of an integrated circuit fabricated in accordance with the present invention. For each of the descriptions provided below, a typical manufacturing process is given for each step. It should be appreciated that other manufacturing processes could be used and other manufacturing would become apparent to a person skilled in the art and, therefore, the recitation of a particular manufacturing process should not be construed to be limiting. It is noted that in some instances conventions such as p– and n+ are given by way of example, in which case the concentrations are not critical to the implementation of the present invention. The corresponding dopant types and concentrations would be apparent to a person skilled in the relevant art. For those instances in which the concentration is critical to the implementation of the present invention, the value of the concentration is specified.

FIGS. 1–4 show selected initial steps in the manufacture of a standard-buried-collector (SBC) npn semiconductor device. The selection of an SBC npn semiconductor device is for convenience only and is not meant to restrict the invention only to SBC npn semiconductor devices as the concepts of the present invention are applicable to other types of semiconductor devices. FIGS. 5–8 show selected continuing steps in the manufacture of the semiconductor device shown in FIGS. 1–4 in which a semiconductor device as known in the prior art is formed. FIGS. 9–12 show selected continuing steps in the manufacture of the semiconductor device shown in FIGS. 1–4 in which a semiconductor device in accordance with the present invention is formed. In the figures, there has not been an attempt to show any of the features to an exact scale. In addition, the vertical dimension is somewhat larger so that the junctions and film thicknesses are actually smaller than they appear in the figures in relation to the horizontal dimension of the various elements.

Figure 1:
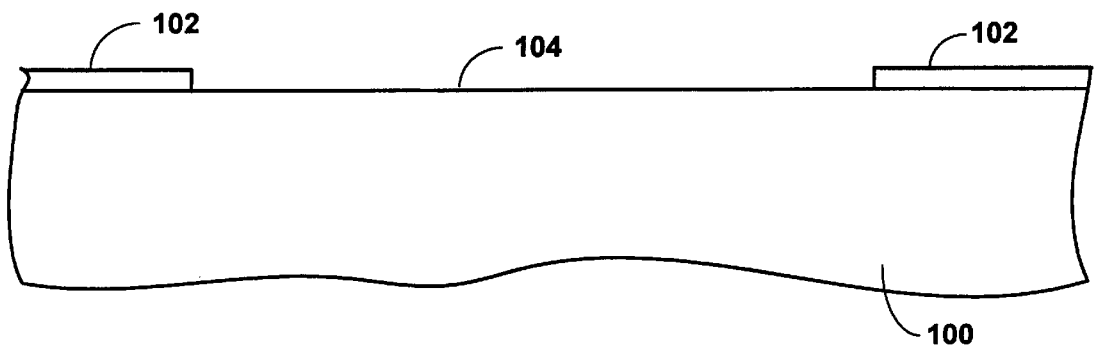
FIGS. 1–4 show selected initial steps in the manufacture of a semiconductor device.

FIG. 1 shows a lightly p-type doped silicon substrate 100 with an oxide layer 102 that has been formed on the surface of the substrate 100 and etched to expose a portion of the surface 104 of the substrate 100. The oxide layer 102 is typically formed by exposing the surface of the substrate 100 to a wet oxidation atmosphere and a high temperature cycle. The substrate doping is selected to be light enough to minimize the parasitic collector-to-substrate depletion-layer capacitance, but heavy enough to prevent it from being changed to n-type during subsequent processing.

Figure 2:
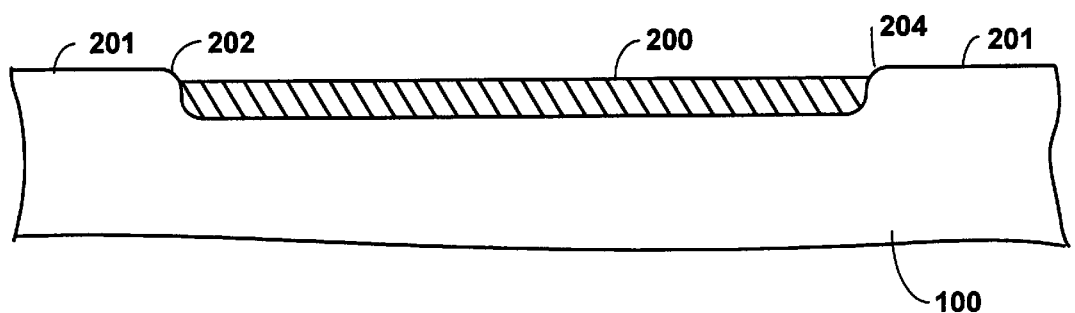

FIG. 2 shows the portion of the substrate 100 shown in FIG. 1 with a layer 200 formed in the portion of the surface 104 defined by the oxide layer 102 shown in FIG. 1 in which a window has been etched. The layer 200 is formed by heavy n+ type diffusion or ion implantation and will become a buried layer during further processing. The buried layer is also called a subcollector. The surface 104 of the substrate 100 is exposed to an appropriate atmosphere containing the selected dopant ions or ion implantation at approximately 30 keV and approximately $10^{15}$ atoms/cm$^2$. In order to minimize the further diffusion of the layer 200 during subsequent processes that are conducted at high temperature, dopants with relatively small diffusion constants such as arsenic and antimony are used to form the layer 200. The highly doped layer 200 provides a low resistance path from the active part of the transistor, to be discussed later, to the collector contact, which will also be discussed later. The oxide layer 102 is removed exposing the surface 201 of the substrate 100. An anneal/drive-in procedure is performed in an oxidizing ambient that causes a new oxide to be formed on the wafer surface. After the diffusion to form the layer 200 a step of approximately 100–200 nm remains in the substrate 100 at the edges of the layer 200. The step is indicated at 202 and 204 and is formed because of the unequal thicknesses of the oxides that have grown on the respective underlying materials. The steps propagate through the epitaxial layer and become the alignment marks that allow subsequent mask levels to be aligned with the buried layer.

Figure 3:
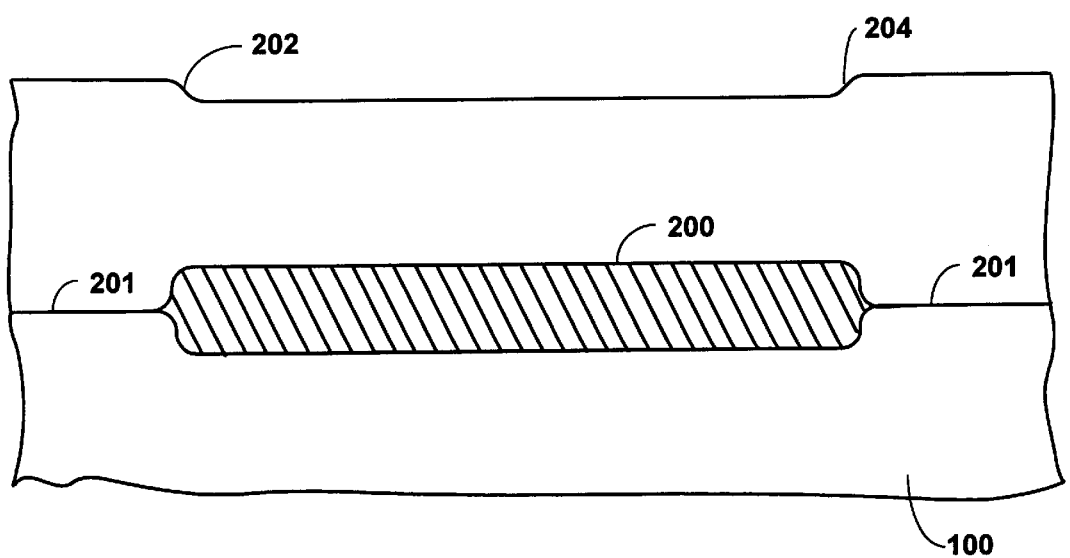

FIG. 3 shows an epitaxial layer 300 grown on the surface of the entire wafer, including the surface 201 of the substrate 100 and the surface of the layer 200. The epitaxial layer 300 is a lightly doped n-type layer and under proper conditions the epitaxial layer 300 is a single-crystal layer that continues the crystal structure of the original substrate. This makes the epitaxial layer 300 suitable for the fabrication of devices. The dopant typically used to form the lightly doped (approximately $10^{15}$–$10^{16}$ atoms/cm$^3$) n-type epitaxial layer is arsenic because of its small diffusivity. The minimum thickness and maximum doping concentration of the epitaxial layer are determined by the avalanche breakdown and reach through limitations on the value of $BV_{CEO}$. During the growth of the epitaxial layer the steps indicated at 202, 204 are shown replicated on the surface of the epitaxial layer 300. The presence of the steps 202 and 204 allows subsequent mask levels to be aligned to the layer 200, which is now buried. During the growth of the epitaxial layer 300, which is done at a high temperature, the buried layer 200 becomes larger because of diffusion of the dopants used to form the buried layer 200. As discussed above, dopants with a low diffusion rate are typically used to minimize the subsequent growth of the buried layer 200.

Figure 4:
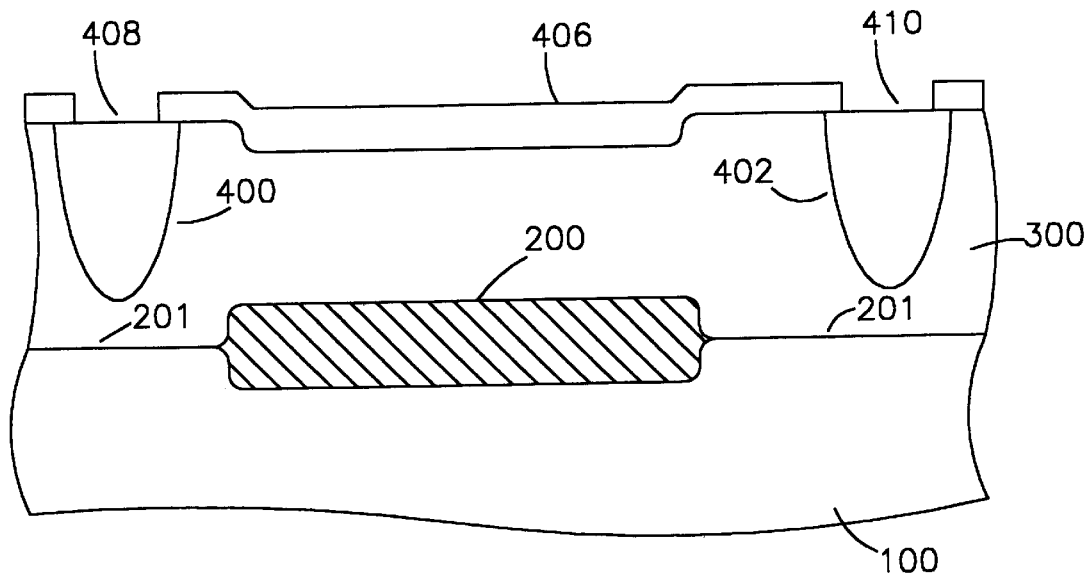
Figure 5:
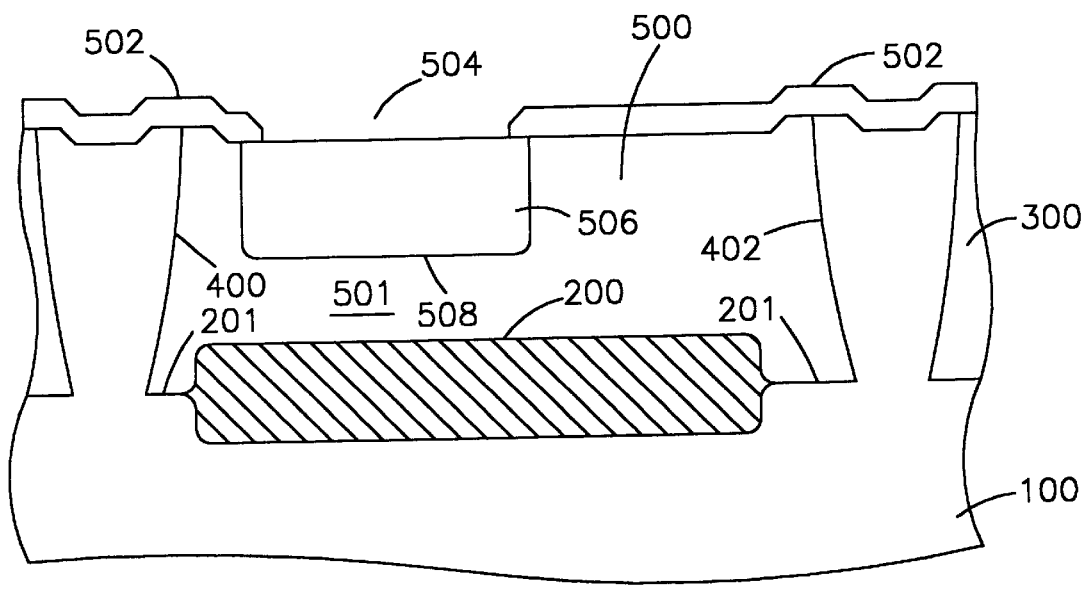
FIGS. 5–8 show selected continuing steps in the manufacture of the semiconductor device shown in FIGS. 1–4 to obtain a prior art semiconductor device.

FIG. 4 shows two isolation structures 400 and 402 formed in the epitaxial layer 300. The isolation structures are formed by growing an oxide layer 406 on the surface of the epitaxial layer 300 and opening windows, indicated at 408 and 410 in the oxide layer 406 at locations where isolation structures are to be formed. A deep p+ type diffusion process, typically using boron, is then performed. The purpose of the isolation structures is to isolate the collectors of the transistors from one another with reverse-biased pn junctions. Thus, the acceptor concentration in the isolation regions must be higher than the donor concentration in the epitaxial layer, and the junction depth (the depth of the isolation structures) must be at least equal to the depth of the epitaxial layer in order for complete isolation to be achieved. As shown in FIG. 4, p+ isolation structures 400 and 402 are formed. Initially, the p+ isolation structures 400 and 402 do not extend to the substrate layer 100. However, subsequent high-temperature processes will cause the p + isolation diffusion making up the isolation structures 400 and 402 to reach as far as the original substrate surface 201 as shown in FIG. 5. It is customary to "overdrive" the isolation diffusion beyond the depth of the epitaxial layer to prevent the possibility that the depletion region could extend beneath the isolation diffusion. Once the p+ isolation diffusion reaches or extends beyond the original substrate layer, there will be an n-type island completely surrounded by p+ type material. This can be clearly seen in FIG. 5. It should be appreciated by one of ordinary skill in the art, that the figures show a cross-section of the device and the structures are all three-dimensional. For example, it should be appreciated that the isolation structures indicated at 400 and 402 surround the region 500 of the device shown in FIG. 5.

FIG. 5 shows the device shown in FIG. 4 with the oxide layer 406 removed and a new oxide layer 502 formed on the device. A base diffusion mask is used to open a window 504 in the oxide and a p-type diffusion process is performed to form the base region 506 of the transistor. The formation of the base region is one of the most critical processes in bipolar transistor fabrication. The base must be aligned so that the collector-base and collector-substrate depletion regions do not merge, following diffusion at the surface. The minimum allowable spacing between the isolation regions and the base region is determinable from knowledge of the applied voltages and the epitaxial-layer doping concentration. The width of the window 504 is limited by the theoretically predicted width of the sideways depletion region that is associated with the collector-base junction 508 and will be discussed in conjunction with FIG. 6. The collector-base junction 508 does not reach as far as the buried layer 200. As a result the region 501 between the base region 506 and the buried layer 200 remains lightly doped, which gives more ideal characteristics for the transistor and also provides a higher breakdown voltage.

Figure 6:
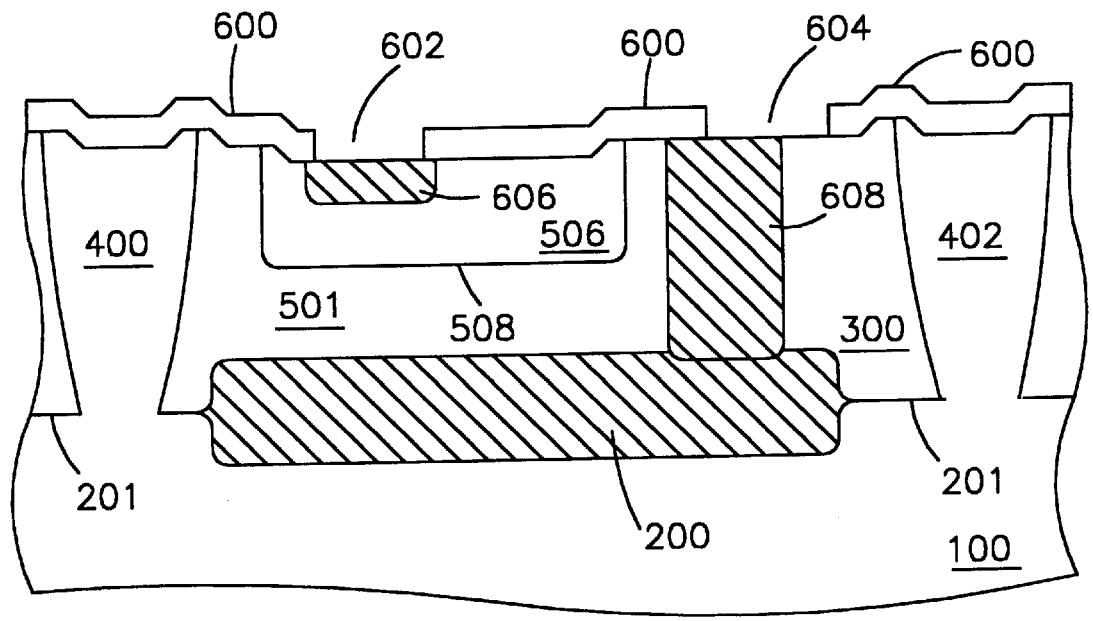

FIG. 6 shows the device shown in FIG. 5 with an oxide layer 600 formed on the surface of the device. In one type of prior art device, a window at 602 is opened in the oxide layer 600 for an emitter diffusion process and a window at 604 is opened at the same time in the oxide layer 600 for a collector diffusion process. In such a device, the combined emitter and collector diffusion process is a shallow, high-concentration n-type diffusion and is performed in an oxidizing ambient so that oxide covers the entire wafer after the diffusion is completed. In another type of device, the emitter diffusion and collector diffusion process shown in FIG. 6 are done in separate diffusion processes. If the collector region 608 is to extend to the buried layer 200 it may be necessary to have the emitter diffusion process separate from the emitter diffusion process so that the emitter diffusion does not diffuse too deeply into the base region 506. The deep diffusion of the collector region (also called a plug or sinker) is necessary in some applications because the value of the $R_C$ (the resistance of the collector to base path) is too high. In junction-isolated SBC devices, the collector contact is typically formed by means of a diffusion process. In other types of devices, an ion implantation process could be used. Phosphorus is chosen for this application since it is a faster-diffusing impurity than arsenic. As can be appreciated, an additional mask must be used to allow the dopant to be selectively introduced only into the collector region. The emitter diffusion process forms the emitter region 606 and the collector diffusion process forms the collector region 608.

Figure 7:
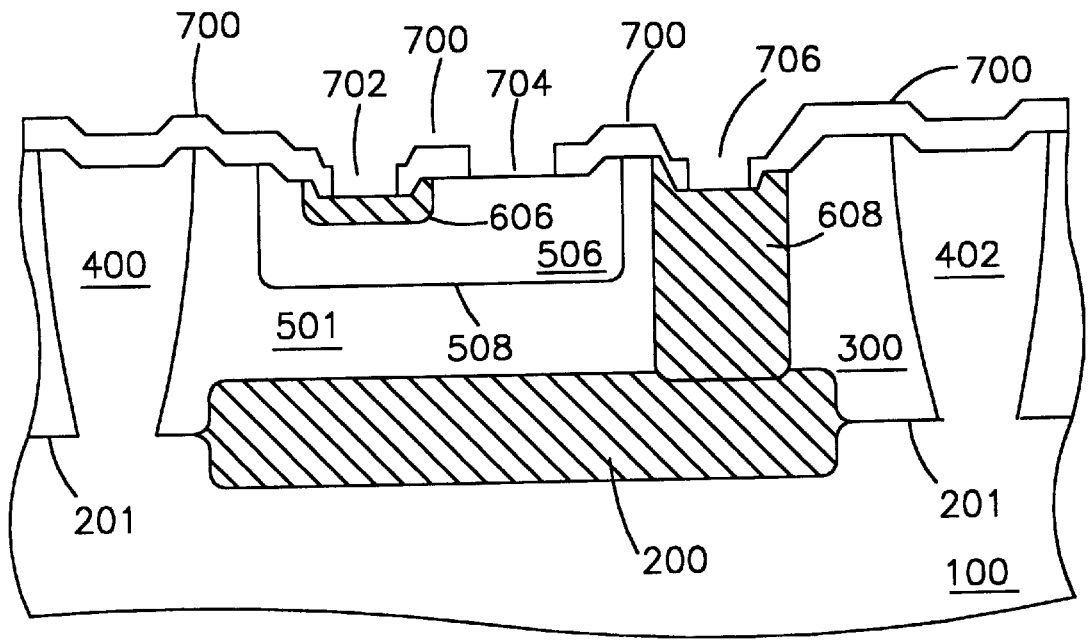

FIG. 7 shows the device shown in FIG. 6, after the contact mask has been used to open windows in the oxide layer 700. There is a window 702 to the emitter region 606, a window 704 to the base region 506, and a window 706 to the collector region 608. The windows 702, 704, and 706 are for the purpose of allowing electrical contacts to be made to the emitter region 606, the base region 506 and the collector region 608.

Figure 8:
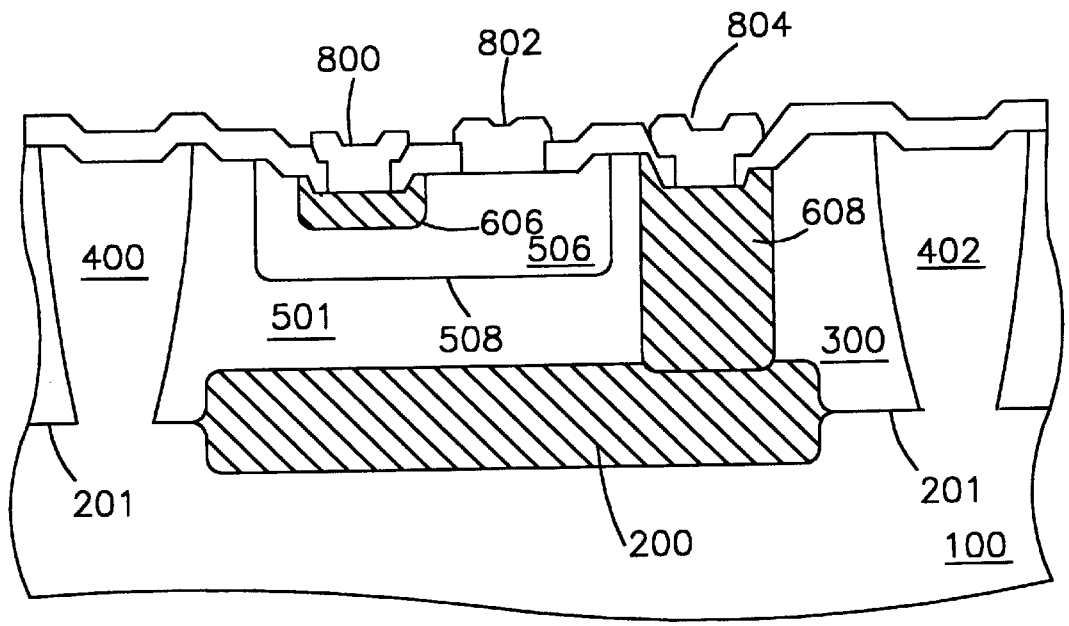

FIG. 8 shows the device shown in FIG. 7, with an electrical contact 800 to the emitter region 606, an electrical contact 802 to the base region 506, and an electrical contact 804 to the collector region 608.

Figure 9:
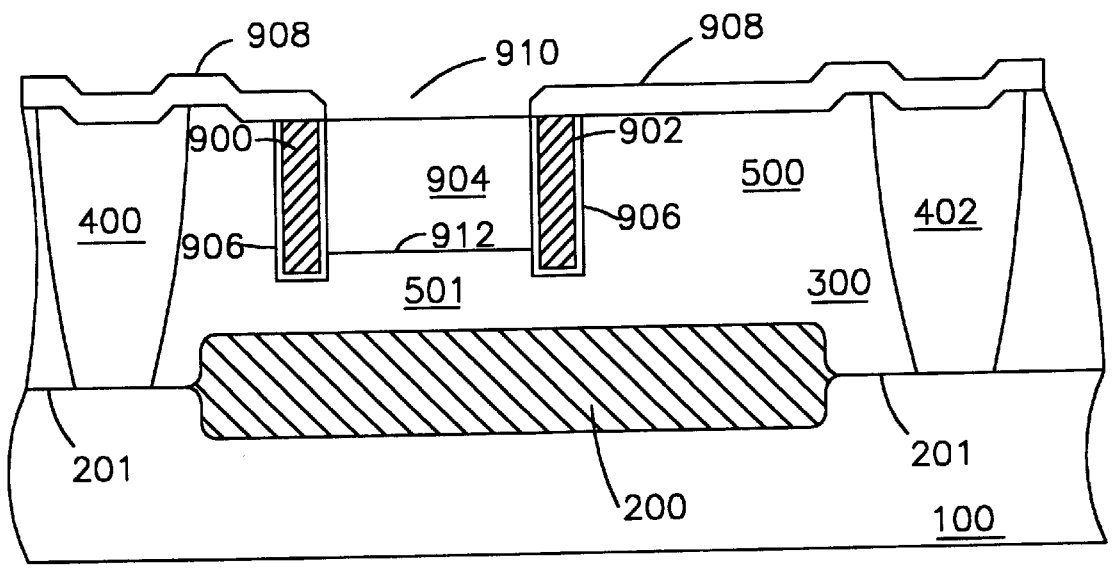
FIGS. 9–12 show selected continuing steps in the manufacture of the semiconductor device shown in FIGS. 1–4 to obtain a semiconductor device in accordance with the present invention.

FIG. 9 shows the device shown in FIG. 4 with a slot having a selected depth formed in the region 500 with a first portion of the slot indicated at 900 and a second portion of the slot indicated at 902. The depth of the slot is selected so that it will extend beyond the base region formed in a prior or a subsequent process. The slot can be formed either before or after the base region 904 is formed. The slot surrounds the base region 904 and therefore the portion 900 and the portion 902 are portions of the same slot. One method of forming the slot is to provide a protection layer consisting of a layer of thermal oxide, a deposited layer of silicon nitride, and a deposited layer of oxide. A layer of photoresist is deposited and a photoresist mask patterns the photoresist and a reactive ion etch (RIE) with chemistry etches through the protection layer, the oxide and nitride to the photoresist. The photoresist is removed and reactive ion etching with chemistry is used to etch the silicon slot. A liner material 906 is formed on the walls of the slot. The liner material depends upon the slot material and could be thermal oxide or silicon nitride. The slot is filled with a material such as polysilicon or tungsten. The slot material is planarized using a chemical mechanical planarization process. Any well-known method of making slots in a silicon device can be used to form the slots. FIG. 9 shows the device shown in FIG. 4 with the oxide layer 406 removed and a new oxide layer 908 formed on the device. A base diffusion mask is used to open a window 910 in the oxide layer 908 and a p-type diffusion process is performed to form the base region 904 of the transistor. The p-type diffusion process to form the base region 904 is controlled to ensure that the base region boundary 912 does not extend beyond the selected depth of the slot portions indicated at 900 and 902. The base region 904 does not reach as far as the buried layer 200. As a result, the region 501 between the base region 904 and the buried layer 200 remains lightly doped, which provides a device with more ideal characteristics for the transistor and also provides a higher breakdown voltage. The base diffusion process performed within the slot portions 900 and 902 provides a collector-base junction 912 that is substantially completely planar; that is, with substantially no spherical or cylindrical curvature such as in the prior art devices.

Figure 10:
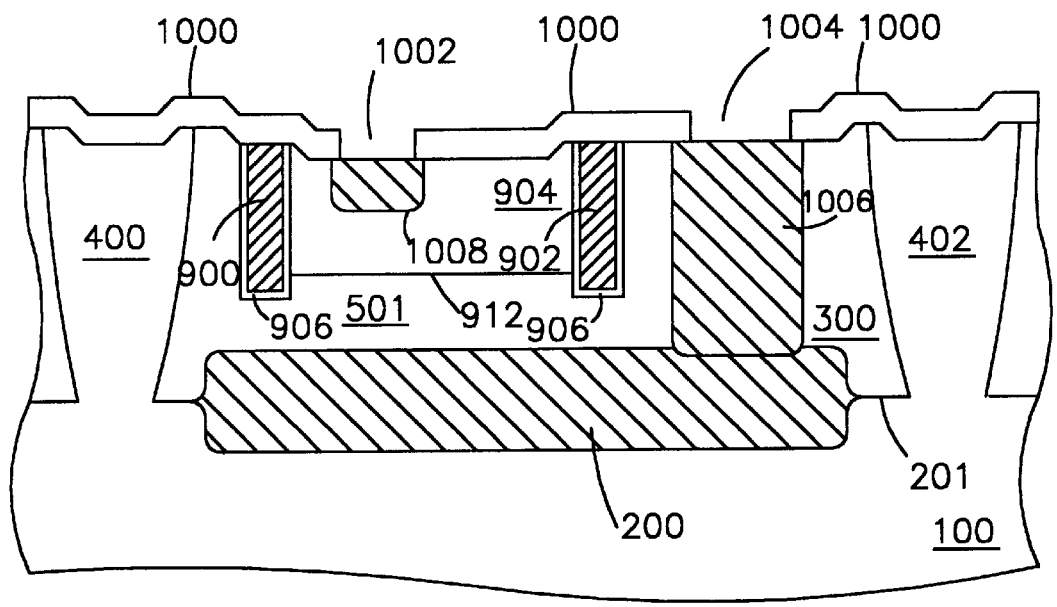

FIG. 10 shows the device shown in FIG. 9 with an oxide layer 1000 formed on the surface of the device. In one type of device, a window at 1002 is opened in the oxide layer 1000 for an emitter diffusion process and a window at 1004 is opened at the same time in the oxide layer 1000 for a collector diffusion process. In such a device, the combined emitter and collector diffusion process is a shallow, high-concentration n-type diffusion and is performed in an oxidizing ambient so that oxide covers the entire wafer after the diffusion is completed. In another type of device, the emitter diffusion and collector diffusion process shown in FIG. 10 are done in separate diffusion processes. If the collector region 1008 is to extend to the buried layer 200 it may be necessary to have the emitter diffusion process separate from the emitter diffusion process so that the emitter diffusion does not diffuse too deeply into the base region 904. The deep diffusion of the collector region is necessary in some applications because the value of the $R_C$ (the resistance of the collector to base path) is too high if a deep diffusion is not done. The deep diffusion of the collector is also called a plug or sinker. In junction-isolated SBC devices, the collector contact is typically formed by means of a diffusion process. In other types of devices, an ion implantation process could be used. Phosphorus is chosen for this application since it is a faster-diffusing impurity than arsenic. As can be appreciated, an additional mask must be used to allow the dopant to be selectively introduced only into the collector region. The emitter diffusion process forms the emitter region 1008 and the collector diffusion process forms the collector region 1006.

Figure 11:
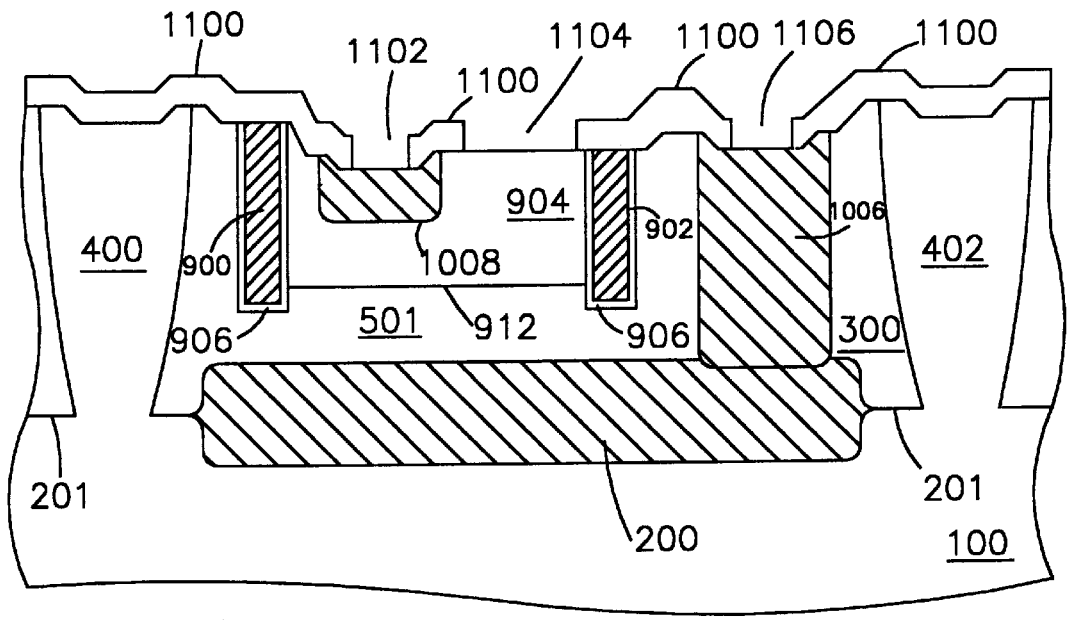

FIG. 11 shows the device shown in FIG. 10, after the contact mask has been used to open windows in the oxide layer 1100 that was formed on the surface of the device. There is a window 1102 to the emitter region 1008, a window 1104 to the base region 904 and a window 1106 to the collector region 1006. The windows 1102, 1104, and 1106 are for the purpose of allowing electrical contacts to be made to the emitter region, the base region and the collector region.

Figure 12:
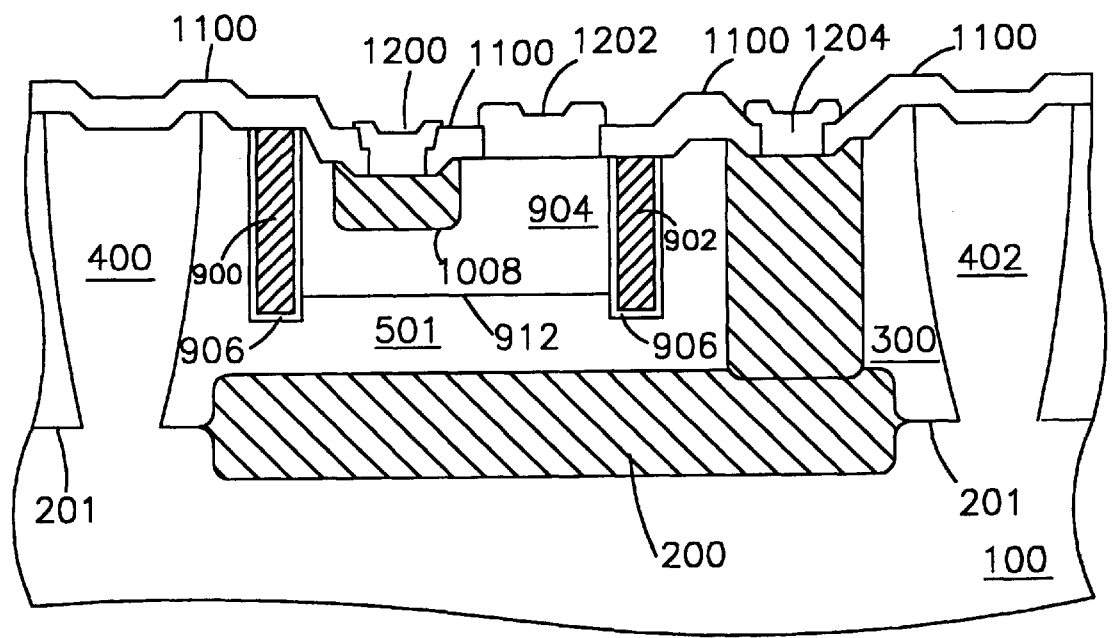

FIG. 12 shows the device shown in FIG. 11 with an electrical contact 1200 to the emitter region 1008, an electrical contact 1202 to the base region 904, and an electrical contact 1204 to the collector region 1006.

Figure 13:
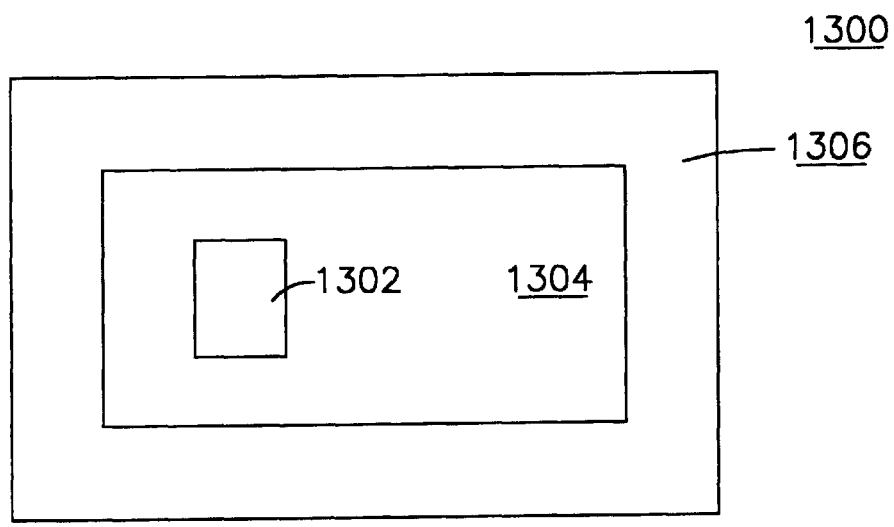
FIG. 13 shows a top view showing the structure of a semiconductor device in accordance with the present invention.

FIG. 13 is a top view of a portion of a semiconductor device 1300 fabricated in accordance with the present invention. An emitter region 1302 is shown in a base region 1304 and the base region 1304 is shown surrounded by a slot 1306.

Figure 14:
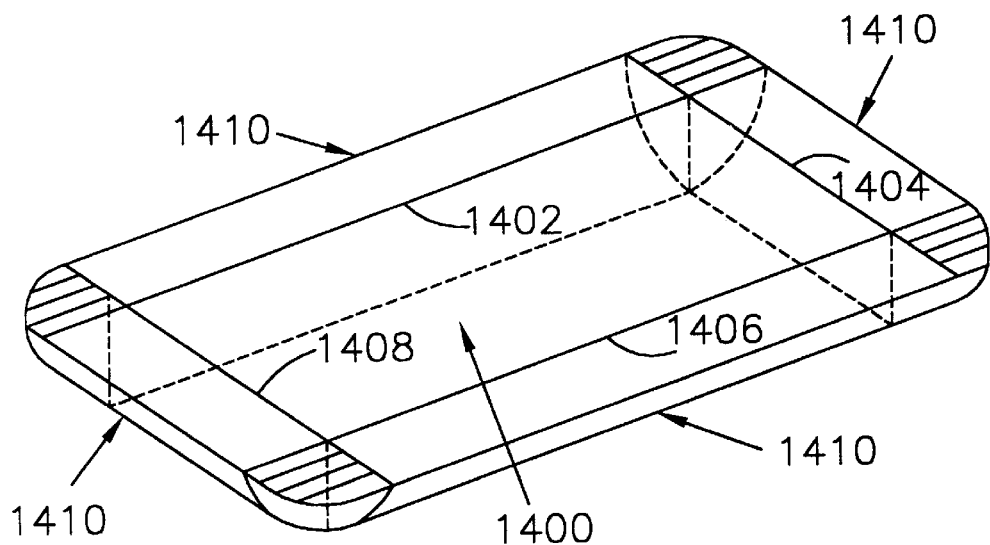
FIG. 14 shows a perspective view of the shape of a base region diffused through a rectangular opening.

FIG. 14 shows the shape of a base region that has been diffused through a rectangular opening in the $SiO_2$ layer. The rectangle, indicated at 1400, bounded by sides 1402, 1404, 1406, and 1408 represents the shape of the opening through which the impurities were diffused. The regions 1410 are regions in which the impurities have diffused sideways under the $SiO_2$ layer and the regions 1410 have a cylindrical shape. The regions 1412 are regions in which the impurities have diffused under the corners under the $SiO_2$ layer and the regions 1412 have a spherical shape. Such junction curvatures enhance the electric field in the curved parts of the associated depletion regions that reduces the breakdown voltage below that predicted by one-dimensional junction theory.

Figure 15:
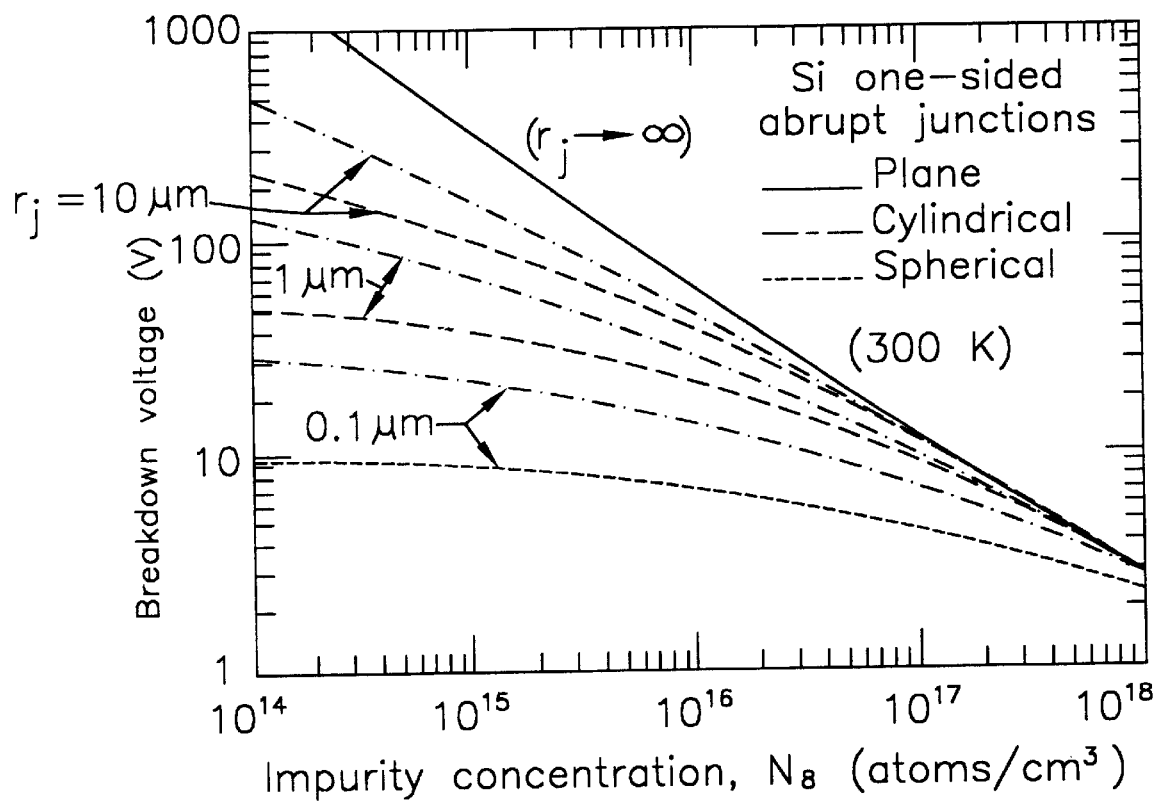
FIG. 15 is a graphical representation of the breakdown voltage versus impurity concentration for different radii of curvature of the junctions between the base and collector regions.

FIG. 15 shows the effects of the curvature of the collector-base junction on breakdown voltage. The breakdown voltage is plotted versus impurity concentration for selected radii of curvature $r_j$ from 0.1 micron to 10 microns and a plot of no curvature ($r_j=\infty$). The smaller radii of curvature are found in devices that have very shallow base regions and as can be seen from FIG. 15, as the radii of curvature becomes smaller the breakdown voltage becomes significantly smaller. This indicates that in the drive towards smaller and smaller devices the decrease in breakdown voltage becomes a very significant problem. For example, a comparison of the breakdown voltages for various devices with an impurity concentration $N_B$ of $10^{15}$ shows the significant effects of increasing the curvature. The breakdown voltage for a device having a plane junction (no curvature) is approximately 320 V. The breakdown voltage for a spherical junction with a radius of 10 microns is approximately 160 volts and the breakdown voltage for a spherical junction with a radius of 0.1 microns is only approximately 9.5 V.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. A semiconductor device having a base region wherein the base region terminates on a slot filled with tungsten that surrounds the base region.

2. The semiconductor device of claim 1, wherein the base region terminates substantially perpendicular to a surface of the slot that surrounds the base region.

3. A semiconductor device of claim 2, wherein the base region and the surrounding slot are formed in an epitaxial region.

4. The semiconductor device of claim 3, further comprising a substrate region on which the epitaxial region is grown.

5. The semiconductor device of claim 4, further comprising a buried layer region formed on a portion of an interface between the substrate region and the epitaxial region.

6. The semiconductor device of claim 5, further comprising a collector region formed in the epitaxial region.

7. The semiconductor device of claim 6, further comprising isolation structures formed around the epitaxial region and extending through the epitaxial region and merging with the substrate region thereby isolating the base and collector region.

8. The semiconductor device of claim 7, further comprising an emitter region formed in the base region.

9. The semiconductor device of claim 8, wherein the collector region extends through the epitaxial region and merges with the buried layer region.

* * * * *